(12) United States Patent
Trinh et al.

(10) Patent No.: US 12,195,851 B2
(45) Date of Patent: Jan. 14, 2025

(54) THIN LAYER DEPOSITION WITH PLASMA PULSING

(71) Applicant: Applied Materials, Inc., Santa Clara, CA (US)

(72) Inventors: Cong Trinh, Santa Clara, CA (US); Maribel Maldonado-Garcia, San Jose, CA (US); Mihaela A. Balseanu, Sunnyvale, CA (US); Alexander V. Garachtchenko, Mountain View, CA (US); Tsutomu Tanaka, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 437 days.

(21) Appl. No.: 17/343,866

(22) Filed: Jun. 10, 2021

(65) Prior Publication Data

US 2021/0388497 A1 Dec. 16, 2021

Related U.S. Application Data

(60) Provisional application No. 63/039,822, filed on Jun. 16, 2020.

(51) Int. Cl.
 *C23C 16/455* (2006.01)
 *C23C 16/505* (2006.01)
 *C23C 16/52* (2006.01)

(52) U.S. Cl.
 CPC .. *C23C 16/45538* (2013.01); *C23C 16/45546* (2013.01); *C23C 16/505* (2013.01); *C23C 16/52* (2013.01)

(58) Field of Classification Search
 CPC ........ C23C 16/45538; C23C 16/45546; C23C 16/505; C23C 16/52; C23C 16/0245; C23C 16/345; C23C 16/45536; H01J 37/32146; H01J 37/32165; H01J 37/32174; H01L 21/02126; H01L 21/02274
 See application file for complete search history.

(56) References Cited

U.S. PATENT DOCUMENTS

| 2009/0047795 A1* | 2/2009 | Matsudo ............. H01L 21/3065 438/758 |
| 2010/0062613 A1 | 3/2010 | Kim et al. |
| 2018/0138405 A1* | 5/2018 | McKerrow ........... C23C 16/345 |
| 2019/0180985 A1 | 6/2019 | Tanaka et al. |
| 2019/0376186 A1 | 12/2019 | Haverkamp et al. |

FOREIGN PATENT DOCUMENTS

| JP | 2010001551 A | 1/2010 |
| JP | 2019056130 A | 4/2019 |

OTHER PUBLICATIONS

"PCT International Search Report and Written Opinion in PCT/US2021/036933 dated Oct. 1, 2021, 9 pages".

\* cited by examiner

*Primary Examiner* — Katherine A Bareford
*Assistant Examiner* — Christina D McClure
(74) *Attorney, Agent, or Firm* — Servilla Whitney LLC

(57) ABSTRACT

Methods of depositing thin films for an electronic device, for example a semiconductor device include applying a first pulsed plasma with or without a reactant and a second continuous plasma with a reactant.

15 Claims, 4 Drawing Sheets

THIN LAYER DEPOSITION WITH PLASMA PULSING

CROSS-REFERENCE TO RELATED APPLICATIONS

This application claims priority to U.S. Provisional Application Ser. No. 63/039,822, filed Jun. 16, 2020, the entire disclosure of which is hereby incorporated by reference herein.

TECHNICAL FIELD

The present disclosure relates generally to apparatus and methods to deposit thin films. In particular, the disclosure relates to apparatus and methods to deposit thin films during plasma-enhanced processes, for example plasma-enhanced atomic layer deposition and plasma-enhanced chemical vapor deposition. Plasma is first provided with pulsed power of plasma, for example a pulsed radio frequency (RF) plasma, to prevent damage to a plasma-sensitive substrate, and thereafter a continuous plasma is used.

BACKGROUND

Semiconductor substrates can be damaged during plasma-enhanced thin layer deposition processes including plasma-enhanced atomic layer deposition (PEALD) and plasma-enhanced chemical vapor deposition (PECVD). Damage can be in the form of chemical damage and/or electrical damage. Chemical damage can be caused by ion bombardment. Electrical damage can be caused by a charge build-up on a surface during exposure to plasma. Substrates that are susceptible to damage caused by plasma are plasma-sensitive substrates.

There is a need in the art for apparatus and methods for plasma-enhanced thin layer deposition processes that reduce or eliminate damage such as charge build-up, energy, and charged species concentration (e.g., ions and electrons).

SUMMARY

One or more embodiments of the disclosure are directed to methods of depositing a film. A substrate in a processing chamber is exposed to a first plasma, and optionally to a first reactant to form a first material film, the substrate being plasma-sensitive. A power of the first plasma is pulsed in the processing chamber to mitigate damage to the substrate. Thereafter, the substrate is exposed to a second reactant and a second plasma to form a second material film on the substrate, the second plasma being supplied at a continuous power. The substrate may comprise a stack of layers, at least one layer of which is plasma-sensitive. The at least one layer may comprise a chalcongen material. In an embodiment, the substrate is exposed to the first reactant to form the first material film on the substrate. In an embodiment, the first reactant is excluded such that pulsing the power of the first plasma pre-treats the substrate prior to forming the second material film. The second material film may be a conformal layer on a stack of layers, at least one layer of which is plasma-sensitive.

In one or more embodiments, the first plasma comprises a radio frequency (RF) plasma.

In one or more embodiments, pulsing the power comprises a pulse period including both an ON time of supplying power to the first plasma and OFF time of not supplying power, the pulse period having a time in range of 1 µsecond to 100 µseconds. The ON:OFF time may be in a range of about 10:1 to about 1:10, or 4:6 to about 6:4, or even 1:1. The ON time may be in the range of about 0.5 µsec to about 50 µsec. The first plasma and the second plasma each independently may comprise: argon (Ar), helium (He), nitrogen ($N_2$), oxygen ($O_2$), hydrogen ($H_2$), ammonia ($NH_3$), or combinations thereof.

Additional embodiments of the disclosure are directed to methods of depositing a film. A substrate comprising two or more layers in a plasma-enhanced atomic layer deposition processing chamber is exposed to a first plasma, the substrate having a breakdown voltage. A power of the first plasma in the plasma-enhanced atomic layer deposition processing chamber is pulsed to prevent a voltage differential on the substrate from exceeding the breakdown voltage. Thereafter, the substrate is exposed to a reactant and a second plasma continuously-supplied to form a material film on the stack.

In one or more embodiments, the first plasma comprises a radio frequency (RF) plasma.

In one or more embodiments, the substrate is exposed to a first reactant with the first plasma to form a first material film on the substrate.

In one or more embodiments, pulsing the power comprises a pulse period including both an ON time of supplying power to the first plasma and OFF time of not supplying power, the pulse period having a time in range of 1 µsecond to 100 µseconds. The ON:OFF time may be in a range of about 10:1 to about 1:10, about 4:6 to about 6:4, or even 1:1. The ON time may be in the range of about 0.5 µsec to about 50 µsec. The first plasma and the second plasma each independently may comprise: argon (Ar), helium (He), nitrogen ($N_2$), oxygen ($O_2$), hydrogen ($H_2$), ammonia ($NH_3$), or combinations thereof.

Further embodiments of the disclosure are directed to non-transitory computer readable medium. The medium includes instructions, that when, when executed by a controller of a processing chamber, causes the processing chamber to perform operations of: pulse a power of a first plasma into a processing volume of the processing chamber having a substrate, to prevent a voltage differential on the substrate from exceeding a breakdown voltage of the substrate; optionally flow a first reactant into the processing volume; flow a second reactant into the processing volume; and supply a second plasma at a continuous power. The method may further comprise: an operation of a pulse period including both an ON time of supplying power to the pre-treatment plasma and OFF time of not supplying power, the pulse period having a time in range of 1 µsecond to 100 µseconds. The method may further comprise: an operation including a radio frequency (RF) controller that controls one or more of: the plasma power, a plasma frequency, and a pulse period.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
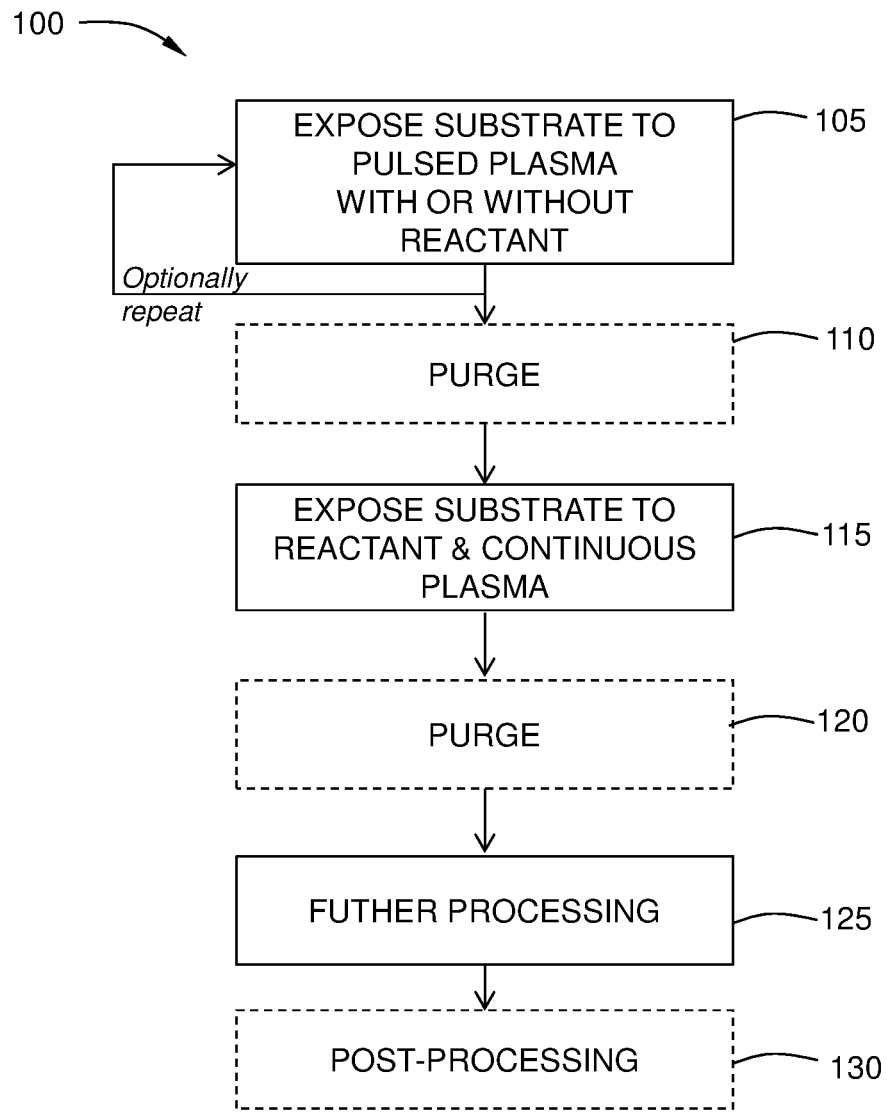
FIG. 1 illustrates a flowchart of exemplary method according to one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

Many of the details, dimensions, angles and other features shown in the Figures are merely illustrative of particular embodiments. Accordingly, other embodiments can have other details, components, dimensions, angles and features without departing from the spirit or scope of the present disclosure. In addition, further embodiments of the disclosure can be practiced without several of the details described below.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate", "substrate surface", or the like, as used herein, refers to any substrate or material surface formed on a substrate upon which processing is performed. For example, a substrate surface on which processing can be performed include, but are not limited to, materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what materials are to be deposited, as well as the particular chemistry used.

As used in this specification and the appended claims, the terms "reactive compound," "reactive gas," "reactive species," "precursor," "process gas," and the like are used interchangeably to mean a substance with a species capable of reacting with the substrate surface or material on the substrate surface in a surface reaction (e.g., chemisorption, oxidation, reduction). For example, a first "reactive gas" may simply adsorb onto the surface of a substrate and be available for further chemical reaction with a second reactive gas.

As used in this specification and the appended claims, the terms "precursor", "reactant", "reactive gas" and the like are used interchangeably to refer to any gaseous species that can react with the substrate surface.

One or more embodiments herein advantageously provide methods to reduce, mitigate, and/or prevent chemical and/or electrical damage to plasma-sensitive substrates caused during continuous application of plasma, including chemical damage from ion bombardment and/or electrical damage caused by the charged built up on the surface during a process using plasma. For example, embodiments herein prevent a voltage differential on the substrate from exceeding a breakdown voltage of the substrate. During continuous application of plasma, a threshold voltage (Vt) shifts results in damage to an electronic device and corresponding degradation in performance. Application of pulsed plasma is an efficient way to mitigate the Vt shift.

Figure 4:
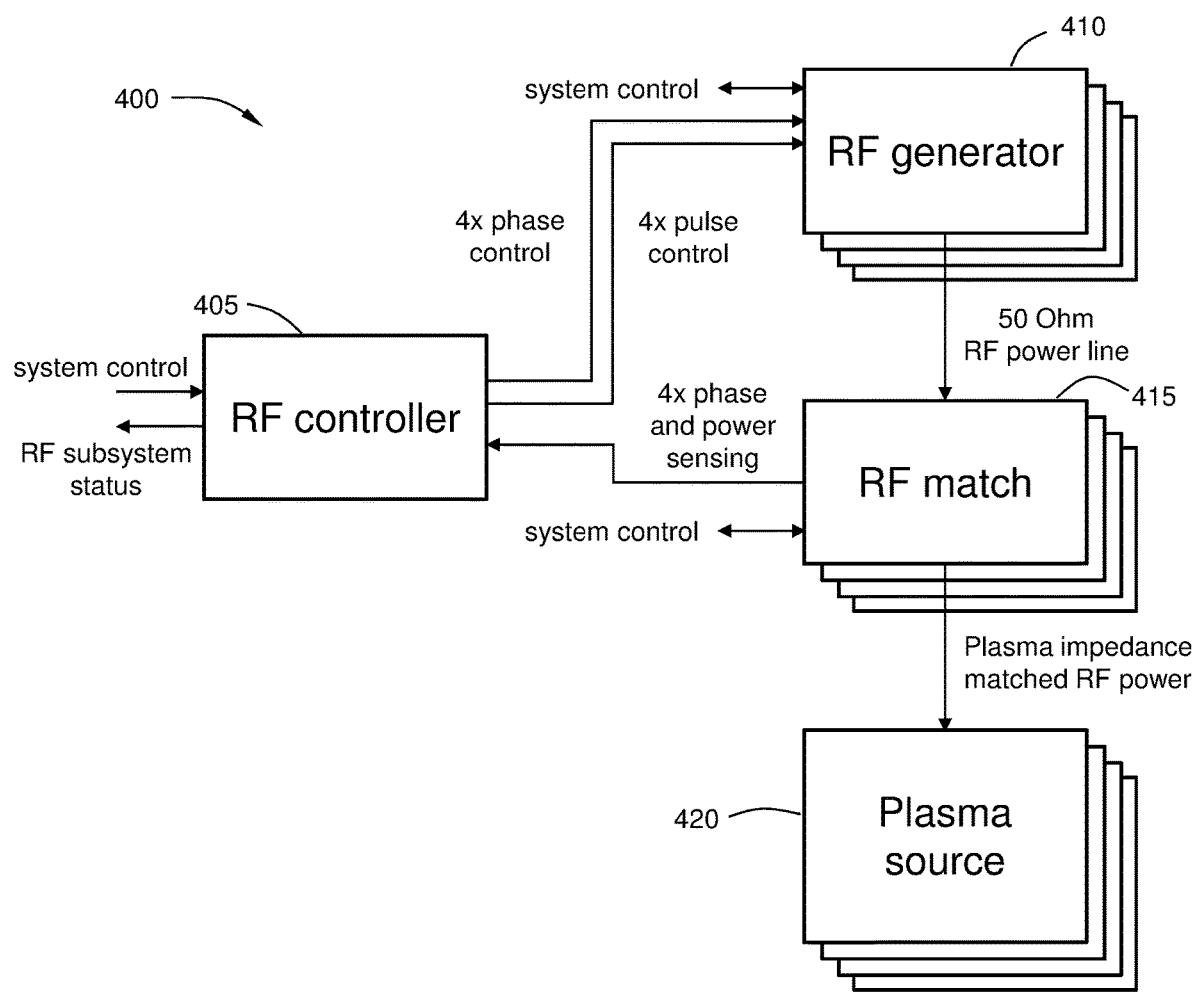
FIG. 4 shows a flowchart of an exemplary control schematic according to one or more embodiments of the disclosure.

Enabling pulse plasma to existing PEALD and PECVD hardware may be implemented easily using RF controller (RFC) and software algorithm discussed with respect to FIG. 4 herein. In addition, plasma power and on/off pulse frequencies in combination with other processing conditions may be tuned to minimize plasma damage while maintaining good film quality and other superior properties of an ALD process: such as uniform film and good step coverage. CVD processes can also benefit.

Reference to "plasma-sensitive" means a substrate that accumulates surface charges and/or chemical interactions of charged species from plasma such that performance of the substrate in a semi-conductor device including the substrate is degraded.

Phase change random-access memory (PCRAM) is a type of emerging non-volatile memory with an increasing number of applications and fast market growth. PCRAM relies on a phase change layer consisting of a chalcogenide material. The chalcogenide materials are sensitive to air and moisture. Silicon nitride (SiN) thin films can be used as encapsulation layers to protect the chalcogenide materials. Stacks used for PCRAM are examples of "plasma-sensitive" substrates.

FIG. 1 illustrates a flowchart for an exemplary method 100 according to one or more embodiments of the disclosure. The method 100 begins at operation 105 with exposing a plasma-sensitive substrate to a pulsed plasma. In this step, a reactant is optionally present. In one embodiment, a pulsed plasma and a reactant are applied to a plasma-sensitive substrate to form a first film. The first film results in minimal to no damage to the substrate, and an optional additional pulse plasma may be used to post-treat the first film to get higher film quality before deposition of the subsequent layers.

In another embodiment, only a pulsed plasma is applied to a plasma-sensitive substrate to pre-treat surfaces of the substrate to facilitate deposition thereafter of a high quality and substantially uniform film.

A "pulse" as used herein is intended to refer to a quantity of plasma that is intermittently or non-continuously introduced into the process chamber. The quantity of a particular compound within each pulse may vary over time, depending on the duration of the pulse.

The durations for each pulse may be the same or variable and may be adjusted to accommodate, for example, the volume capacity of the processing chamber as well as the capabilities of a vacuum system coupled thereto.

In some embodiments, operation 105 is conducted during a plasma-enhanced atomic layer deposition (PEALD) method which comprises a plurality of processes performed in a suitable processing chamber. The PEALD process comprises at least one deposition cycle comprising exposure of the substrate surface to a first reactive gas and a first plasma.

In other embodiments, operation 105 is conducted during a plasma-enhanced chemical vapor deposition (PECVD) method which comprises a plurality of processes performed in a suitable processing chamber. The PECVD process comprises at least one deposition cycle comprising exposures of the substrate surface to a first reactive gas and a first plasma.

Purge 110 is an optional operation depending on the thin film deposition method. For example, in a time-domain ALD process, exposure to each reactant and plasma is separated by a time delay to allow each compound to adhere and/or react on the substrate surface and then be purged from the processing chamber. In a spatial ALD process, different portions of the substrate surface, or material on the substrate surface, are exposed simultaneously to the reactant and plasma so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

At operation 115, the substrate is exposed to a continuous plasma and a reactant to form a film.

Purge 120 is an optional operation depending on the thin film method discussed with respect to purge 110.

Substrates exposed to a first pulsed plasma operation and a second continuous plasma operation may thereafter be further processed at operation 125. Optional post-processing may also be conducted at operation 130.

Figure 2:
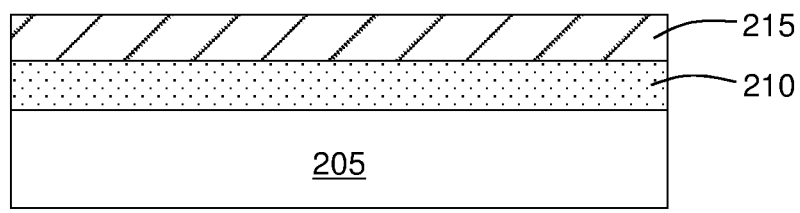
FIG. 2 depicts a cross-sectional view of an electronic device of one or more embodiments of the disclosure.

Turning to FIG. 2, an electronic device 200, such as a semi-conductor device, comprises a plasma-sensitive substrate 205. First material film 210 is deposited using pulsed plasma and a reactant. Second material film 215 is deposited using continuous plasma and a reactant. In one or more embodiments, the plasma-sensitive substrate 205 comprises a plurality of layers. In one or more embodiments, the plurality of layers comprises one or more layers containing chalcogenide materials. An exemplary layer that is plasma-sensitive comprises germanium, antimony, and tellurium (GST). An exemplary layer that is plasma-sensitive comprises germanium, silicon, arsenic, and tellurium (OST).

In one or more embodiments, the first material film 210 can comprise any suitable material known to the skilled artisan. In one or more embodiments, the first material layer comprises one or more a dielectric material or a metal. In one or more embodiments, the first material layer comprises SiN, SiOx (where x is in the range of 1-4), SiCN, SiCON, and combinations thereof.

In one or more embodiments, the second material film 215 can comprise any suitable material known to the skilled artisan. In one or more embodiments, the second material layer comprises one or more a dielectric material or a metal. In one or more embodiments, the second material layer comprises SiN, SiOx (where x is in the range of 1-4), SiCN, SiCON, and combinations thereof.

Pulse plasma (with optimal power and pulse period that doesn't cause any substrate damage) can be used to deposit the first layer of film directly on the sensitive substrate. After that, continuous plasma (with higher power, for example, and no pulse) can be used to deposit higher film quality on top of the first film.

For stacks of three or more films, for example, the approach can be as follows. First film: uses lowest power, shortest pulse to mitigate and/or avoid damage. Second film: deposited at higher power, longer pulse on time. And third film: highest power, no pulse.

In one or more embodiments with the film stack approach, the first film causes no damage to substrate, and higher power and shorter exposure time may be used to improve deposition rate and improve the productivity without sacrificing film quality.

With the film stack approach, the first film results in minimal to no damage to the substrate, and an optional additional pulse plasma may be used post-treat the film to get higher film quality before deposition of the subsequent layers.

Figure 3A:
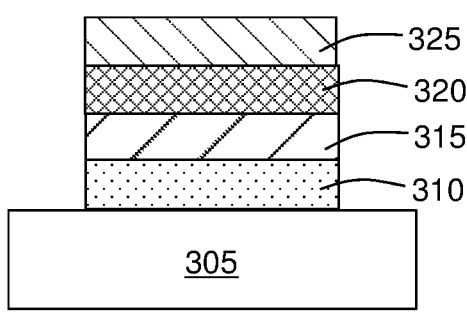
FIGS. 3A-3C show an electronic device of one or more embodiments of the disclosure at different stages during production.
Figure 3B:
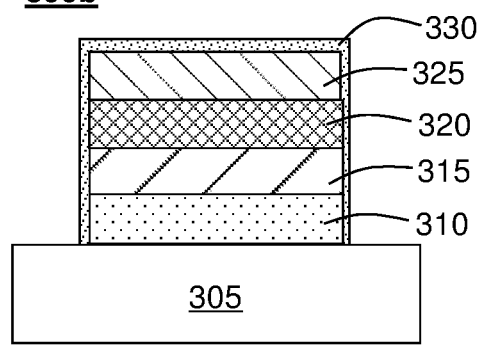
Figure 3C:
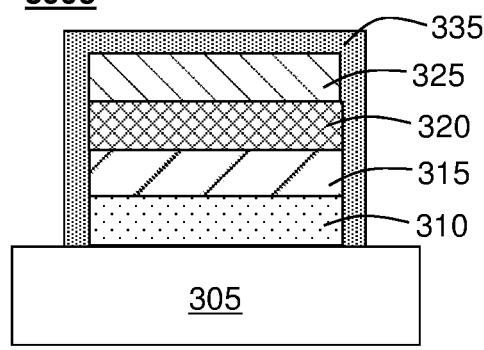

In FIGS. 3A-3C an electronic device of one or more embodiments of the disclosure is shown at different stages during production. In FIG. 3A, electronic device 300a comprises a substrate 305 and a stack of layers: first layer 310, second layer 315, third layer 320, and fourth layer 325. It is understood that the number of layers may vary according to a design of the device. In one or more embodiments, the stack is a PCRAM stack. Within the stack is a plasma-sensitive layer. In one or more embodiments, the plasma-sensitive layer contains a chalcogenide material. An exemplary plasma-sensitive layer comprises: germanium, antimony, and tellurium (GST). An exemplary layer that is plasma-sensitive comprises: germanium, silicon, arsenic, and tellurium (OST). Another exemplary layer that is plasma-sensitive comprises: germanium, silicon, arsenic, and tellurium (OST).

In FIG. 3B, an electronic device 300b is formed by exposing the electronic device 300a to a pulsed plasma treatment in the absence of a reactant. The resulting electronic device 300b comprises a treated surface 330 that is present along the stack of layers: including portions of the first layer 310, the second layer 315, the third layer 320, and the fourth layer 325.

In FIG. 3C, an electronic device 300c is formed by exposing the electronic device 300b to a continuous plasma treatment in the presence of a reactant thereby forming a film. The resulting electronic device 300c comprises a conformal film 335 that is of high quality and uniformity conformally-deposited on the stack of layers: including portions of the first layer 310, the second layer 315, the third layer 320, and the fourth layer 325. In one or more embodiments, the conformal film comprises silicon nitride (SiN). Pulse plasma can be conducted to provide pre-treatment on substrates prior to film deposition to prevent nucleation delay: this is advantageous when the sensitive substrate consists of different materials with very different surface compositions, like for PCRAM applications. Application of pulsed plasma minimizes and/or prevents substrate damage, and helps to deposit film uniformly on the whole stack of films.

In one or more embodiments, a main materials stack of PCRAM device may be considered a plasma-sensitive substrate. In one or more production steps of PCRAM, a dielectric film (such as SiN) is deposited on top of a material stack comprising: C/GST/OTS and other metal electrodes such as titanium (Ti), tungsten (W), and the like. The electrodes may be a metal or a combination of metals.

In FIG. 4, a flowchart of an exemplary control schematic 400 according to one or more embodiments of the disclosure is shown. This control schematic is applicable to operation 105 providing pulsed plasma of method 100 in FIG. 1. Pulse is controlled by a closed loop system controls and verifies whether the plasma pulse is working properly with correct frequencies. A software algorithm controls the RF controller and verifies the feedback signal from the pulse. Specifically, a radio frequency (RF) controller 405 receives communication from a central system control as understood in the art and a plurality of RF match modules 415. The RF controller 405 provides communication to an RF subsystem status module. In this embodiment, there are 4 plasma sources and a corresponding number of RF match modules 415 and RF generator modules 410. It is understood that the number of plasma sources, RF match modules, and RF generator modules may be modified according to process needs. The RF controller 405 provides communication to the RF generator modules 410 for 4× phase control and 4× pulse control. The RF generator modules 410 send and receive communications to and from the central system control. The RF generator modules 410 communicate to the RF match modules 415 by a standard impedance RF transmission line (50 Ohm). The RF match modules 415 also send and receive communications to and from the central system control. The RF match modules 415 communicate to the plasma sources 420 to control plasma impedance matched RF power.

In one or more embodiments, suitable plasma hardware includes but is not limited to: 3 mm holes CCP plasma pies, slot RF pies vertical plasma source (VPS) or Microwave (MW). In one or more embodiments, plasma frequencies are provided in a range of from 10 MHz to 1.5 GHz. In one or more embodiments, pulse periods (ON/OFF) have a duration ranging in time from 1 microsecond to 100 microseconds. Other process parameters include: plasma power, process pressure, and plasma exposure time. Any combination of gases widely used in PEALD or PECVD are suitable: argon (Ar), helium (He), nitrogen ($N_2$), oxygen ($O_2$), hydrogen ($H_2$), ammonia ($NH_3$), and combinations thereof, with various ratios. Process parameters can combined and adjusted to obtain good film quality film and good step coverage.

Reference throughout this specification to "one embodiment," "certain embodiments," "one or more embodiments" or "an embodiment" means that a particular feature, structure, material, or characteristic described in connection with the embodiment is include in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of depositing a film, the method comprising:
exposing a substrate comprising a stack of layers, at least one layer of which is plasma-sensitive and comprises a chalcogen material, in a processing chamber to a first plasma, and optionally to a first reactant to form a first material film, the substrate being plasma-sensitive;
pulsing a power of the first plasma in the processing chamber to mitigate damage to the substrate;
thereafter exposing the substrate to a second reactant and a second plasma to form a second material film on the substrate; and
supplying the second plasma at a continuous power.

2. The method of claim 1, wherein the substrate is exposed to the first reactant to form the first material film on the substrate.

3. The method of claim 1 comprising excluding the first reactant such that pulsing the power of the first plasma pre-treats the substrate prior to forming the second material film.

4. The method of claim 3, wherein the second material film is a conformal layer on a stack of layers, at least one layer of which is plasma-sensitive.

5. The method of claim 1, wherein the first plasma comprises a radio frequency (RF) plasma.

6. The method of claim 1, wherein pulsing the power comprises a pulse period including both an ON time of supplying power to the first plasma and OFF time of not supplying power, the pulse period having a time in range of 1 µsecond to 100 µseconds.

7. The method of claim 6, wherein the ON: OFF time is in a range of about 1:10 to about 10:1.

8. The method of claim 7, wherein the ON: OFF time is about 1:1.

9. The method of claim 8, wherein the ON time is in the range of about 0.5 µsec to about 50 µsec.

10. The method of claim 1, wherein the first plasma and the second plasma each independently comprise: argon (Ar), helium (He), nitrogen ($N_2$), oxygen ($O_2$), hydrogen ($H_2$), ammonia ($NH_3$), or combinations thereof.

11. A method of depositing a film, the method comprising:
exposing a substrate comprising two or more layers, at least one layer of which is plasma-sensitive and comprises a chalcogen material, in a plasma-enhanced atomic layer deposition processing chamber to a first plasma, the substrate having a breakdown voltage;
pulsing a power of the first plasma in the plasma-enhanced atomic layer deposition processing chamber to prevent a voltage differential on the substrate from exceeding the breakdown voltage; and
thereafter exposing the substrate to a reactant and a second plasma continuously-supplied to form a material film on the stack.

12. The method of claim 11, wherein the first plasma comprises a radio frequency (RF) plasma.

13. The method of claim 11, further comprising exposing the substrate to a first reactant with the first plasma to form a first material film on the substrate.

14. The method of claim 11, wherein pulsing the power comprises a pulse period including both an ON time of supplying power to the first plasma and OFF time of not supplying power, the pulse period having a time in range of 1 µsecond to 100 µseconds.

15. The method of claim 14, wherein the ON time is in the range of about 0.5 μsec to about 50 μsec.

\* \* \* \* \*